United States Patent
McCormick et al.

(10) Patent No.: US 7,342,356 B2
(45) Date of Patent: **\*Mar. 11, 2008**

(54) ORGANIC ELECTROLUMINESCENT DEVICE HAVING PROTECTIVE STRUCTURE WITH BORON OXIDE LAYER AND INORGANIC BARRIER LAYER

(75) Inventors: Fred B. McCormick, Maplewood, MN (US); Manoj Nirmal, St. Paul, MN (US); George V. Tiers, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 215 days.

This patent is subject to a terminal disclaimer.

(21) Appl. No.: 10/948,011

(22) Filed: Sep. 23, 2004

(65) Prior Publication Data

US 2006/0061272 A1 Mar. 23, 2006

(51) Int. Cl.
*H01J 1/62* (2006.01)
(52) U.S. Cl. ...................... 313/512; 313/506
(58) Field of Classification Search ............. 313/512, 313/506
See application file for complete search history.

(56) References Cited

U.S. PATENT DOCUMENTS

| | | |
|---|---|---|
| 5,047,687 A | 9/1991 | VanSlyke |
| 5,188,901 A | 2/1993 | Shimizu |
| 5,440,446 A | 8/1995 | Shaw et al. |
| 5,607,789 A | 3/1997 | Treger et al. |
| 5,652,067 A | 7/1997 | Ito et al. |
| 5,686,360 A | 11/1997 | Harvey, III et al. |
| 5,739,545 A | 4/1998 | Guha et al. |
| 5,811,177 A | 9/1998 | Shi et al. |
| 5,882,761 A | 3/1999 | Kawami et al. |
| 5,952,778 A | 9/1999 | Haskal et al. |
| 6,146,225 A | 11/2000 | Sheats et al. |
| 6,226,890 B1 | 5/2001 | Boroson et al. |
| 6,284,342 B1 | 9/2001 | Ebisawa et al. |
| 6,383,048 B1 | 5/2002 | Yang et al. |
| 6,413,645 B1 | 7/2002 | Graff et al. |
| 6,497,598 B2 | 12/2002 | Affinito |
| 6,696,157 B1 | 2/2004 | David et al. |
| 2001/0041268 A1 | 11/2001 | Arai et al. |

(Continued)

FOREIGN PATENT DOCUMENTS

EP 0 741 419 A2 6/1996

(Continued)

OTHER PUBLICATIONS

Patent Abstracts for Japanese Patents 2002-299040 A, 2002-123017 A, 2001-1326071 A, and 2000-223264 A.

(Continued)

*Primary Examiner*—Joseph Williams
*Assistant Examiner*—Bumsuk Won
(74) *Attorney, Agent, or Firm*—Lance L. Vietzke

(57) ABSTRACT

An organic electroluminescent device comprises a substrate that supports a first electrode, a second electrode, and a light emitting structure that is disposed between the first and second electrodes. A protective structure comprising a layer of boron oxide and an inorganic barrier layer cooperates with the substrate to encapsulate the first electrode, the second electrode, and the light-emitting structure.

15 Claims, 3 Drawing Sheets

U.S. PATENT DOCUMENTS

| | | |
|---|---|---|
| 2002/0052752 A1 | 5/2002 | Landesmann |
| 2002/0068143 A1 | 6/2002 | Silvernail et al. |
| 2002/0135296 A1 | 9/2002 | Aziz et al. |
| 2003/0071567 A1* | 4/2003 | Eida et al. .................. 313/504 |
| 2003/0164677 A1 | 9/2003 | Miyaguchi et al. |
| 2004/0046500 A1 | 3/2004 | Stegamat et al. |
| 2004/0135503 A1* | 7/2004 | Handa et al. ................ 313/511 |
| 2004/0195960 A1 | 10/2004 | Czeremuszkin et al. |
| 2004/0209126 A1 | 10/2004 | Ziegler et al. |

FOREIGN PATENT DOCUMENTS

| | | |
|---|---|---|
| EP | 0 777 280 A2 | 6/1997 |
| EP | 0 777 281 B1 | 7/2001 |
| EP | 1 227 527 A2 | 7/2002 |
| JP | 60-219042 | 11/1960 |
| JP | 5600639 A | 1/1981 |
| JP | 2000-223264 A | 8/2000 |
| JP | 2001-1326071 A | 11/2001 |
| JP | 2002-123017 A | 4/2002 |
| JP | 2002-299040 A | 10/2002 |
| WO | WO 00/36661 | 6/2000 |
| WO | WO 01/05205 A1 | 1/2001 |
| WO | WO 01/39287 A1 | 5/2001 |
| WO | WO 01/89006 A1 | 11/2001 |
| WO | WO 2004/030115 A1 | 4/2004 |
| WO | WO2005/015655 A1 | 2/2005 |

OTHER PUBLICATIONS

Chen, C.H., et al., Macromol. Symp. 125, 1 (1997).

Fujikawa, H., et al., *Energy Structures of Triphenylamine Oligomers*, Synthetic Metals, 91, 161 (1997).

Grazulevicius, J.V., et al., *Charge-Transporting Polymers and Molecular Glasses*, Handbook of Advanced Electronic and Photonic Materials and Devices, H.S. Nalwa (ed.), 10 233-274 (2001).

U.S. Appl. No. 10/948,013 to McCormick et al. filed Sep. 23, 2004 entitled *Protected Polymeric Film*.

Office Action from related case, U.S. Appl. No. 10/948,013, dated Mar. 8, 2007.

Office Action from related case, U.S. Appl. No. 10/948,013, dated Jan. 23, 2007.

Office Action from related case, U.S. Appl. No. 10/948,013, dated Oct. 4, 2006.

Office Action from related case, U.S. Appl. No. 10/948,013, dated Jun. 5, 2007.

* cited by examiner

ORGANIC ELECTROLUMINESCENT DEVICE HAVING PROTECTIVE STRUCTURE WITH BORON OXIDE LAYER AND INORGANIC BARRIER LAYER

TECHNICAL FIELD

This invention relates to improved organic electroluminescent devices and, more particularly, to organic electroluminescent devices that have been protected to reduce the absorption of moisture by the device. This invention also relates to a method of protecting an organic electroluminescent device against the undesirable absorption of moisture by the device.

BACKGROUND

Organic electroluminescent devices (e.g., organic light emitting diodes) are useful in a variety of lighting applications and in the preparation of high and low resolution displays. These devices typically include an organic electroluminescent material disposed between an anode and a cathode. The devices may also contain moisture-reactive electrode materials or electroluminescent materials and susceptibility of organic light emitting diodes (OLEDs) to moisture degradation is well known. Consequently, organic electroluminescent devices that contain reactive materials are usually encapsulated to extend the useful lifetimes of the devices. Encapsulation typically involves positioning and sealing the electrodes and electroluminescent material between two substrates such as glass and polymeric materials or between a substrate and a metal can and often in the presence of a desiccant. Various other protective layers can also be included to further reduce contact of the reactive materials with moisture.

SUMMARY OF THE INVENTION

In one embodiment, the invention provides an organic electroluminescent device that comprises a low moisture permeable substrate (e.g., glass, metal, silicon, or a protected polymeric film) that supports a first electrode, a second electrode, and a light emitting structure that is disposed between the first and second electrodes; and a protective structure that cooperates with the substrate to encapsulate the first electrode, the second electrode, and the light-emitting structure. The protective structure comprises a layer of boron oxide and an inorganic barrier layer. Preferably, the inorganic barrier layer has low moisture permeability.

The layer of boron oxide may be disposed over the first electrode, the second electrode, and the light-emitting structure, and the inorganic barrier layer may be disposed over the layer of boron oxide. The inorganic barrier layer preferably comprises an inorganic oxide, boride, nitride, carbide, oxynitride, oxyboride, or oxycarbide, such as silicon or aluminum oxides, nitrides or carbides; diamond-like carbon compounds; and metals such as silicon, aluminum or combinations thereof. Specific examples include silicon oxide (monoxide or dioxide), silicon nitride, aluminum oxide or silicon aluminum oxide. The inorganic barrier layer may be a multilayer construction comprising, for example, alternating polymeric and inorganic layers.

The device may additionally comprise a buffer layer to protect the layer of boron oxide from reaction with the first electrode, the second electrode, and/or the light-emitting structure. The buffer layer may be disposed over the first electrode, the second electrode, and the light-emitting structure, the layer of boron oxide may be disposed over the buffer layer, and the inorganic barrier layer may be disposed over the layer of boron oxide. The buffer layer preferably comprises an organometallic compound or a chelate compound such as tris(8-hydroxyquinoline) aluminum (AlQ) or copper phthalocyanine (CuPc).

The protective structure may additionally comprise a second inorganic barrier layer. In such constructions, a buffer layer (if present) is disposed over the first electrode, the second electrode, and the light-emitting structure, the inorganic barrier layer is disposed over the buffer layer, the layer of boron oxide is disposed over the inorganic barrier layer, and the second inorganic barrier layer is disposed over the layer of boron oxide.

In another embodiment, the invention relates to a method of protecting an organic electroluminescent device. The method comprises providing an organic electroluminescent assembly comprising a low moisture permeable substrate that supports a first electrode, a second electrode, and a light emitting structure disposed between the first and second electrodes; and applying a protective structure that cooperates with the substrate to encapsulate the first electrode, the second electrode, and the light-emitting structure. The protective structure comprises a layer of boron oxide and an inorganic barrier layer.

The layer of boron oxide may be applied by thermal evaporation, the inorganic barrier layer may be applied by vapor deposition, and if the device additionally comprises a buffer layer, it may be applied by either thermal evaporation or vapor deposition.

BRIEF DESCRIPTION OF THE DRAWINGS

The invention will be more fully appreciated with reference to the following non-limiting and not-to-scale drawings in which the same reference symbols designate like or analogous components throughout and in which.

DETAILED DESCRIPTION

Broadly, and in one aspect, the invention provides an organic electroluminescent device comprising a low moisture permeable substrate that supports a first electrode, a second electrode, and a light-emitting structure that is disposed between the first and second electrodes. A protective structure cooperates with the substrate to encapsulate the first electrode, the second electrode, and the light-emitting structure against the undesirable absorption of moisture. The protective structure comprises a layer of boron oxide and an inorganic barrier layer.

For convenience, the first electrode, the second electrode, and the light-emitting structure that is disposed therebetween are sometimes collectively referred to herein as the "operational components" or the organic electroluminescent assembly of the organic electroluminescent (OEL) device, these components being operationally arranged such that passing an electric current between the electrodes causes light to be emitted by the light-emitting structure. The light-emitting structure typically comprises an organic electroluminescent material, and at least one of the electrodes typically can transmit light emitted by the organic electroluminescent material.

The "protective structure" broadly refers to the layer of boron oxide and the inorganic barrier layer, these layers cooperating with the low moisture permeable substrate to encapsulate the operational components of the OEL device. By "encapsulate" it is meant that the protective structure and the substrate collectively surround or enclose the exposed, moisture sensitive surfaces of the operational components of the OEL device so as to reduce their exposure to moisture that could be absorbed by the operational components. An OEL device according to the invention has a reduced ability to absorb moisture relative to the same device that does not have the protective structure.

OEL devices such as organic light-emitting diodes (OLEDs) may degrade in the presence of moisture and the reactive metals used for the electrodes in such devices may corrode when exposed to moisture. These and other organic electronic devices such as light valves, liquid crystal displays, thin film transistors, and other electronic components, will benefit from being protected according to the invention.

Figure 1:
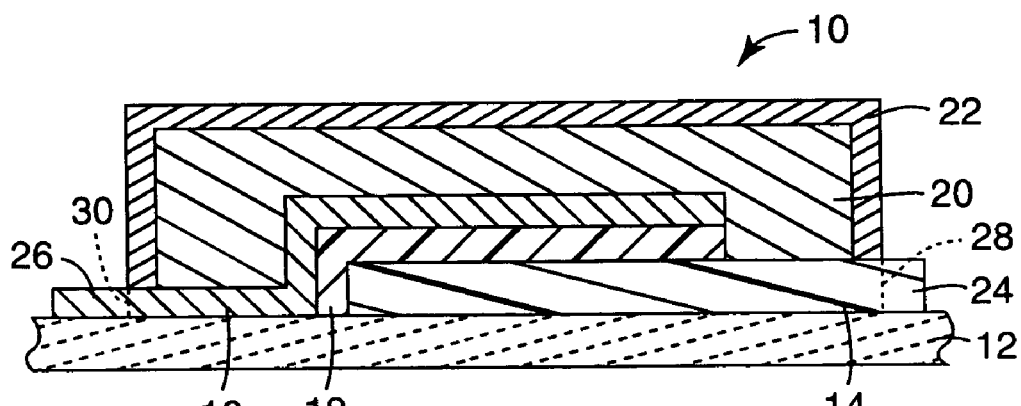
FIG. 1 is a schematic, sectional view of a first embodiment of an organic electroluminescent device according to the invention.

Turning now to the drawings, FIG. 1 shows an organic electroluminescent (OEL) device 10 comprising a low moisture permeable substrate 12 that supports a first electrode 14, a second electrode 16, and a light-emitting structure 18 that is disposed between the first and second electrodes. A protective structure comprising a layer of boron oxide 20 and an inorganic barrier layer 22 cooperates with low moisture permeable substrate 12 to encapsulate first electrode 14, second electrode 16, and light-emitting structure 18 (i.e., the operational components of OEL device 10).

To facilitate connecting OEL device 10 to a power supply, the device also includes a contact pad 24 that is in electrical communication with first electrode 14, and a contact pad 26 that is in electrical communication with second electrode 16. Typically, contact pad 24 is a continuous, unbroken extension of first electrode 14, and contact pad 26 is a continuous, unbroken extension of second electrode 16. In this event, it will be understood that the periphery of the protective structure defines the boundary between first electrode 14 and contact pad 24, and the boundary between second electrode 16 and contact pad 26. The periphery of the protective structure and the two boundaries are represented by broken lines 28 and 30, respectively, in FIG. 1. Thus, the operational components of OEL device 10 in FIG. 1 are encapsulated by the cooperation of the protective structure and substrate 12.

A "low moisture permeable substrate" means and may be provided by any material that is sufficiently resistant to moisture transmission that it is suitable for supporting the operational components of an OEL device, as well as any other materials, components and/or layers that may comprise the OEL device or the protective structure. OEL devices typically require protection from moisture in excess of the levels that can be measured by commercially available equipment such as that provided by MOCON (Modem Controls, Minneapolis, Minn.). While MOCON equipment is typically capable of measuring moisture permeation rates as low as $5 \times 10^{-4}$ grams/square meter/day (g/m$^2$/day), permeation rates as low as $1 \times 10^{-6}$ g/m$^2$/day have been described as a desirable target. Accordingly, a "low moisture permeable" substrate more preferably has a moisture permeation rate of less than $5 \times 10^{-4}$ g/m$^2$/day, preferably less than $1 \times 10^{-5}$ g/m$^2$/day, and even more preferably less than $1 \times 10^{-6}$ g/m$^2$/day as measured pursuant to ASTM Test Method F-1249.

Within these guidelines, suitable low moisture permeable substrates include glass, silicon, metals and metal foils (e.g., aluminum, copper and stainless steel), and polymeric sheets or films that have been treated to address any inherent tendency of the polymer to transmit moisture as discussed more fully below in conjunction with FIGS. 4-9.

First and second electrodes 14 and 16 may be formed of the same materials or different materials. Typically they are formed using electrically conducting materials such as metals, alloys, metallic compounds, metal oxides, conductive ceramics, conductive dispersions, and conductive polymers, including, for example, gold, platinum, palladium, aluminum, calcium, titanium, titanium nitride, indium tin oxide, fluorine tin oxide, and polyaniline. First and second electrodes 14 and 16 may be single layers of electrically conducting material or multiple layers. For example, the electrodes may include a layer of aluminum and a layer of gold, a layer of calcium and a layer of aluminum, a layer of aluminum and a layer of lithium fluoride, or a metal layer and an electrically conductive organic layer. Methods for preparing the electrodes include, but are not limited to, sputtering, vapor deposition, laser thermal patterning, inkjet printing, screen printing, thermal head printing, and photolithographic patterning.

Light-emitting structure 18 may be a single layer or multiple layers and typically contains at least one organic electroluminescent material which could be fluorescent or phosphorescent. Suitable examples include a small molecule (SM) emitter (e.g., a non-polymeric emitter), a SM doped polymer, a light emitting dendrimer, a light-emitting polymer (LEP), a doped LEP, or a blended LEP. The organic electroluminescent material can be provided alone or in combination with any other organic or inorganic materials that are functional or non-functional in an organic electroluminescent display or device.

Useful SM electroluminescent materials include charge transporting, charge blocking, and semiconducting organic or organometallic compounds such as N,N'-bis(3-methylphenyl)-N,N'-diphenylbenzidine (TPD) and metal chelate compounds such as tris(8-hydroxyquinoline) aluminum (AlQ). Typically, these materials can be vacuum deposited or coated from solution to form thin layers in a device and, in practice, multiple layers of SM materials are often used to produce efficient organic electroluminescent devices since a given material generally does not have both the desired charge transport and electroluminescent properties.

LEP materials are typically conjugated polymeric or oligomeric molecules that preferably have sufficient film-forming properties for solution processing. "Conjugated polymers or oligomeric molecules" refer to polymers or oligomers having a delocalized α-electron system along the polymer backbone. Such polymers or oligomers are semiconducting and can support positive and negative charge carriers along the polymeric or oligomeric chain. Exemplary classes of suitable LEP materials include poly(phenylenevinylenes), poly(para-phenylenes), polyfluorenes, other LEP materials now known or later developed, and co-polymers or blends thereof. Suitable LEPs can also be molecularly doped, dispersed with fluorescent dyes or photoluminescent materials, blended with active or non-active materials, dispersed with active or non-active materials, and the like.

LEP materials can be formed into a light-emitting structure by casting a solvent solution of the LEP material on a substrate and evaporating the solvent to produce a polymeric film or in situ on a substrate by reaction of precursor species. Other formulation methods include laser thermal patterning, inkjet printing, screen printing, thermal head printing, photolithographic patterning, and extrusion coating.

Although not shown separately in FIG. 1, light-emitting structure 18 may optionally contain, and preferably does contain, other functional layers such as a hole transport layer, an electron transport layer, a hole injection layer, an electron injection layer, a hole blocking layer, an electron blocking layer, and the like. These and other layers and materials can be used to alter or tune the electronic properties and characteristics of the OEL device. For example, such layers and materials can be used to achieve a desired current/voltage response, a desired device efficiency, a desired brightness, and the like. Additionally, photoluminescent materials may be present to convert the light emitted by the organic electroluminescent materials to another color.

For example, a hole transport layer may be positioned between the other layers of the light-emitting structure and the first or second electrode to facilitate the injection of holes from one electrode (e.g., the anode) into the OEL device and their migration toward the recombination zone. A hole transport layer may further act as a barrier for the passage of electrons to the anode. Materials suitable for use as the hole transport layer include a diamine derivative such as N,N'-bis(3-methylphenyl)-N,N'-bis(phenyl)benzidine or N,N'-bis(3-naphthalen-2-yl)-N,N'-bis(phenyl)benzidine, or a triarylamine derivative such as 4,4',4"-Tris(N,N-diphenylamino)triphenylamine or 4,4',4"-Tris(N-3-methylphenyl-N-phenylamino)triphenylamine. Other suitable materials include copper phthalocyanine, 1,3,5-Tris(4-diphenylaminophenyl)benzenes, and compounds such as those described in H. Fujikawa, et al., Synthetic Metals, 91, 161 (1997) and J. V. Grazulevicius, P. Strohriegl, "Charge-Transporting Polymers and Molecular Glasses," Handbook of Advanced Electronic and Photonic Materials and Devices, H. S. Nalwa (ed.), 10, 233-274 (2001).

Similarly, an electron transport layer may be positioned between the other layers of the light-emitting structure and the first or second electrode to facilitate the injection of electrons and their migration towards the recombination zone. The electron transport layer can further act as a barrier for the passage of holes to the cathode. Preventing the holes from reaching the cathode and the electrons from reaching the anode will result in an electroluminescent device having higher efficiency. An electron transport layer may be formed using the organometallic compound tris(8-hydroxyquinolato) aluminum; 1,3-bis[5-(4-(1,1-dimethylethyl)phenyl)-1,3,4-oxadiazol-2-yl]benzene; 2-(biphenyl-4-yl)-5-(4-(1,1-dimethylethyl)phenyl)-1,3,4-oxadiazole; and compounds described in C. H. Chen, et al., Macromol. Symp. 125, 1 (1997) and J. V. Grazulevicius, P. Strohriegl, "Charge-Transporting Polymers and Molecular Glasses", Handbook of Advanced Electronic and Photonic Materials and Devices, H. S. Nalwa (ed.), 10, 233 (2001).

With continued reference to FIG. 1, the protective structure comprises boron oxide layer 20 and inorganic barrier layer 22. Several advantages are associated with using boron oxide in the present invention, although it will be understood that not every advantage will necessarily be reflected in each application that incorporates a boron oxide layer. Boron oxide may be deposited on or otherwise applied to light-emitting structure 18 as an optically clear or transparent glass-like material, which may be advantageous for OEL devices if this layer needs to be able to transmit light from the light-emitting structure. In addition, the boron oxide layer may reduce the tendency of the OEL device to absorb moisture, whether trapped internally during fabrication, or from the ambient environment. While not wishing to be bound by a particular theory, it is believed that the boron oxide scavenges moisture by reacting with it to yield boric acid, a relatively weak acid, the solid form of which is not likely to be detrimental to the OEL device. This can be represented by the reaction of one molecule of boron oxide with three molecules of water, $B_2O_3 + 3H_2O \rightarrow 2B(OH)_3$. Additional reaction products in the form of evolved gasses or liquids are not liberated.

Boron oxide also offers certain processing advantages that may be desirable depending upon the application. For example, boron oxide may be applied to light-emitting structure 18 by several techniques including sputtering, chemical vapor deposition, electron beam deposition, and thermal evaporation approaches (e.g., vapor deposition). Vapor deposition is a preferred method when the target surface is susceptible to damage from more energetic application methods such as sputtering. Desirably, boron oxide can be vapor deposited at an acceptable rate under moderate conditions (e.g., deposition rates of about 10 to 50 Å/sec may be achieved under a vapor pressure of about $10^{-6}$ to $10^{-4}$ Torr), and without showing signs of decomposition (e.g., discoloration of the source material).

Boron oxide layer 20 is provided on that portion of the OEL device that is intended to be protected against moisture transmission and will be determined by the individual application. The thickness of boron oxide layer 20 will also vary substantially depending upon the nature of the OEL device, moisture conditions to which the OEL device is likely to be exposed during use, other layers present in the protective structure, requirements for optical transparency, cost, etc. As layer thickness increases, resistance to moisture transmission will increase, but perhaps at the expense of reduced transparency, reduced flexibility, and increased cost. Within these guidelines boron oxide layer 20 is provided at an effective thickness, by which is meant a thickness sufficient to reduce the absorption of moisture by the OEL device, relative to the same OEL device that does not have the boron oxide layer. More specifically, the boron oxide layer is preferably provided at a thickness of about 50 Å to 10,000 Å, more preferably about 500 Å to 5,000 Å, and even more preferably about 3,000 Å to 5,000 Å.

Still referring to FIG. 1, the protective structure also comprises inorganic barrier layer 22, which cooperates with boron oxide layer 20 to protect the OEL device. Inorganic barrier layer 22 may provide protection against exposure to moisture, oxygen, and heat and/or mechanical impact, although it is most often included as a moisture and/or oxygen barrier. In this capacity, it is preferred that inorganic barrier layer 22 be selected to further protect the operational components of the OEL device from moisture absorption. It is also preferred that inorganic barrier layer 22 not be reactive with boron oxide layer 20 or other layers adjacent to the inorganic barrier layer. In certain applications it may be desirable for inorganic barrier layer 22 to be deposited or otherwise applied as an optically clear or transparent material, which may be advantageous for applications where this layer needs to be able to transmit light from light-emitting structure 18.

A variety of materials may be employed as the inorganic barrier layer. Preferred inorganic barrier layer materials include metal oxides, metal nitrides, metal carbides, metal oxynitrides, metal oxyborides, and combinations thereof, e.g., silicon oxides such as silica, aluminum oxides such as alumina, titanium oxides such as titania, indium oxides, tin oxides, indium tin oxide, tantalum oxide, zirconium oxide, niobium oxide, boron carbide, tungsten carbide, silicon carbide, aluminum nitride, silicon nitride, boron nitride, aluminum oxynitride, silicon oxynitride, boron oxynitride, zirconium oxyboride, titanium oxyboride, and combinations thereof. Indium tin oxide, silicon oxide, aluminum oxide and combinations thereof are especially preferred inorganic barrier layer materials. The inorganic barrier layer may be applied or formed using techniques employed in the film metallizing art such as sputtering (e.g., cathode or planar magnetron sputtering), evaporation (e.g., resistive or electron beam evaporation), chemical vapor deposition, plating and the like. Materials suitable for inorganic barrier layer 22 depend partly on the protective function that it is intended to play, but glass and inorganic oxides (e.g., oxides of silicon, aluminum or combinations thereof, such as silicon monoxide, silicon dioxide, aluminum oxide or silicon aluminum oxide) are quite useful. Further examples of inorganic barrier layers useful in this invention include materials fabricated using Plasma Enhanced Chemical Vapor Deposition (PE-CVD), such as those described in U.S. Pat. No. 6,696,157 (David).

In another embodiment, inorganic barrier layer 22 may be provided by a multilayer construction comprising, for example, alternating polymeric and inorganic layers. The inorganic layers may be provided by any of the materials noted above for the inorganic barrier layer, and the polymeric layers may be, for example, (meth)acrylates, polyesters, fluorinated polymers, parylenes, cyclotenes, or polyalkylenes. Multilayer constructions may be prepared by way of a "PML" (i.e., polymer multilayer) process, or other techniques in which the layers are applied, as appropriate, by sputtering, spin-coating, thermal evaporation, chemical vapor deposition, etc. Suitable examples of multilayer constructions are described in, for example, U.S. Pat. No. 5,440,446 (Shaw), U.S. Pat. No. 6,497,598 (Affinito), European Patent Publication No. 0 777 280 A2 (Motorola), WO 01/89006 A1 (Battelle Memorial Institute), and U.S. Patent Publication No. 2002/0068143 (Silvernail, et al.).

The thickness of inorganic barrier layer 22 will also vary substantially depending upon the nature of the OEL device, moisture/air conditions to which the OEL device is likely to be exposed during use, other layers present in the protective structure, requirements for optical transparency, cost, etc. As layer thickness increases, resistance to moisture transmission will increase, but perhaps at the expense of reduced transparency, reduced flexibility, and increased cost. Within these guidelines inorganic barrier layer 22 is provided at an effective thickness, by which is meant a thickness sufficient to increase the ability of the OEL device to resist transmission of moisture, resist thermal and/or mechanical impact, etc. relative to the same device that does not have a protective structure that includes the inorganic barrier layer. More specifically, the inorganic barrier layer is preferably provided at a thickness of about 0.5 µm to 70 µm, more preferably about 1.5 µm to 40 µm, and even more preferably about 3.5 µm to 30 µm.

The embodiment of the OEL device shown in FIG. 1, where boron oxide layer 20 is intermediate inorganic barrier layer 22 and the operational components of the OEL device (i.e., encroaching moisture encounters the inorganic barrier layer before encountering the boron oxide layer), offers certain advantages. This arrangement permits boron oxide layer 20 to be deposited in an essentially continuous layer, but without the need to rigorously avoid forming pinholes and other similar defects that frequently accompany vapor deposition and other processes because inorganic barrier layer 22 also resists moisture transmission and is the layer that first encounters encroaching moisture (relative to the boron oxide layer). This arrangement also permits boron oxide layer 20 to provide a "last line of defense" in reducing moisture absorption by the OEL device.

Figure 2:
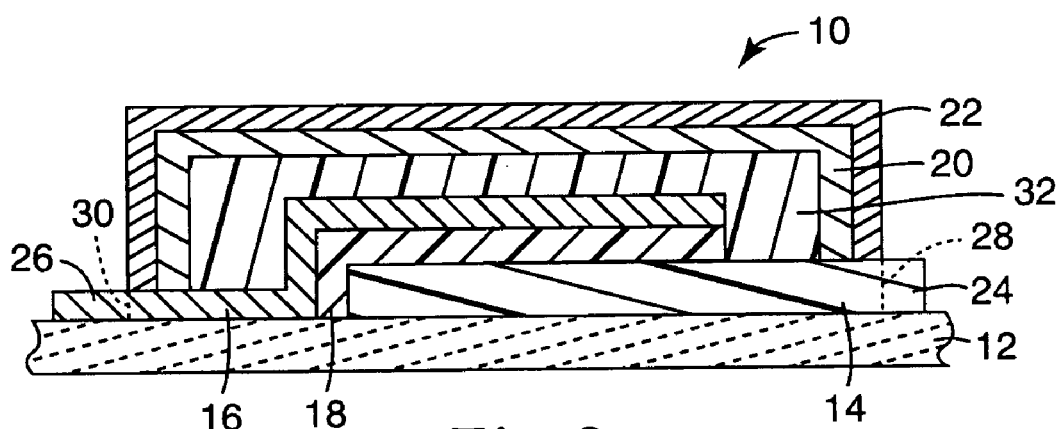
FIG. 2 is a schematic, sectional view of a second embodiment of an organic electroluminescent device according to the invention.

Turning now to FIG. 2, another embodiment of an OEL device according to the invention is illustrated. The embodiment of FIG. 2 is similar to the embodiment of FIG. 1, except that an optional buffer layer 32 has been interposed between boron oxide layer 20 and the operational components of the OEL device. A "buffer layer" refers to a layer that separates the protective structure from the operational components of the OEL device, though it may be electrically active. The buffer layer may perform a wide variety of possible functions. For example, the buffer layer may provide a smooth surface on which to deposit the boron oxide or other layers or it may provide an anchoring or priming layer that improves the adhesion of any subsequently formed layers. The buffer layer may protect any subsequently formed layers from reaction with the inorganic barrier layer or the boron oxide layer. The buffer layer may perform an optical function. Typically, the buffer layer is also encapsulated by the cooperation of the protective structure and the low moisture permeable substrate.

Buffer layer 32 may be formed from a wide variety of materials, both organic and inorganic, and the actual selection will be influenced by the particular function or functions that the buffer layer is intended to serve. For example, if layers that will form a portion of the OEL device will be adjacent to the buffer layer, materials that are not oxidizing agents, not hygroscopic, not acidic, and that are non-reactive with these layers might be preferred. Materials that can be used to provide an electrically active layer might also be included as the buffer layer, and examples include copper phthalocyanine (CuPc), 4,4',4"-tris(N-3-methylphenyl-N-phenylamino)triphenylamine (MTDATA), N,N'-bis(3-naphthalen-2-yl)-N,N'-bis(phenyl)benzidine (NPD), tris(8-hydroxyquinoline) aluminum (ALQ), gold, silicon monoxide, etc. The thickness of buffer layer 32 also depends on the function that the buffer layer is intended to serve, but thicknesses in the range of about 500 Å to 2,000 Å have generally been found to be useful.

Figure 3:
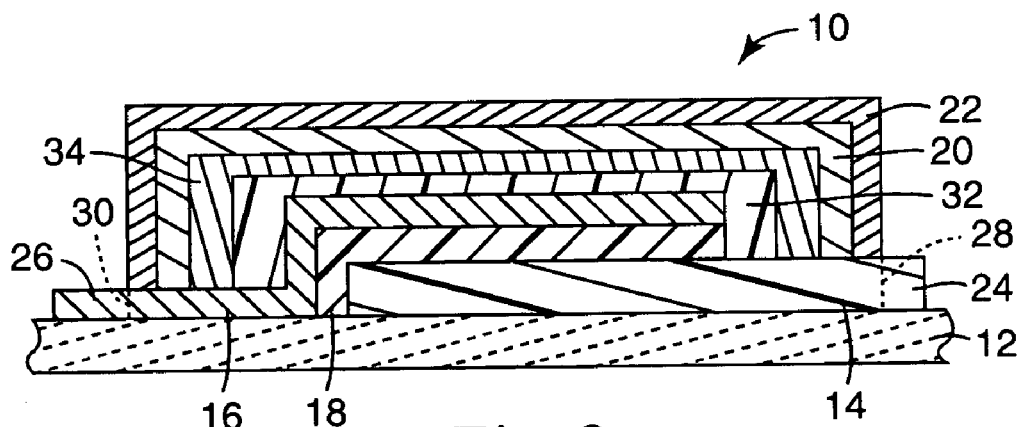
FIG. 3 is a schematic, sectional view of a third embodiment of an organic electroluminescent device according to the invention.

Turning now to FIG. 3, another embodiment of an OEL device according to the invention is illustrated. The embodiment of FIG. 3 is similar to the embodiment of FIG. 2, except that an optional second inorganic barrier layer 34 has been interposed between buffer layer 32 and boron oxide layer 20. Second inorganic barrier layer 34 is similar to inorganic barrier layer 22, and the foregoing discussion of inorganic barrier layer 22 is applicable to second inorganic barrier layer 34. The embodiment of FIG. 3 offers the additional advantage of giving enhanced protection to OEL device 10 as a result of second inorganic barrier layer 34.

Figure 4:
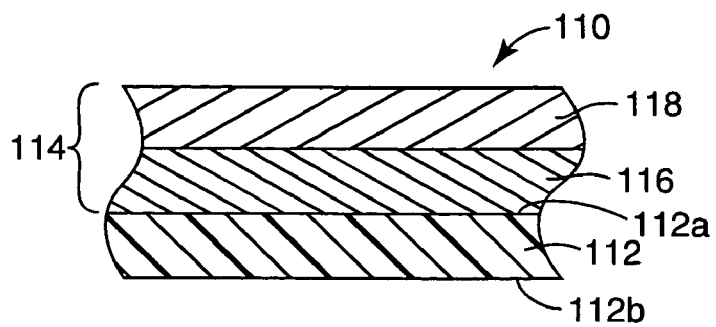
FIG. 4 is a schematic sectional view of a first embodiment of a protected polymeric film that may be used as a low moisture permeable substrate in an organic electroluminescent device according to the invention.

It was previously mentioned that low moisture permeable substrate 12 may be provided by a polymeric film that has been treated to address any inherent tendency of the polymeric film to transmit moisture. Such polymeric films are referred to as "protected polymeric films" and are illustrated in FIGS. 4-9. FIG. 4 shows a protected polymeric film 110 comprising a polymeric film substrate 112 having a first major surface 112a and a second major surface 112b opposite the first major surface 112a. A protective structure 114 is provided on at least the first major surface 112a of substrate 112. Protective structure 114 comprises a layer of boron oxide 116 and an inorganic barrier layer 118. Preferably, there are no intervening layers between substrate 112 and protective structure 114 as this could impair the ability of the protective structure to reduce the transmission of moisture through the substrate. Similarly, it is preferred that there be no intervening layers between boron oxide layer 116 and inorganic barrier layer 118, as this too could impair the ability of protective structure 114 to reduce the transmission of moisture by substrate 112.

FIG. 4 illustrates boron oxide layer 116 as being intermediate substrate 112 and inorganic barrier layer 118; however, the relative position of these two layers could be reversed such that inorganic barrier layer 118 is intermediate substrate 112 and boron oxide layer 116. Preferred are those constructions in which the inorganic barrier layer and the boron oxide layer are arranged such that encroaching oxygen and moisture encounter the inorganic barrier layer before encountering the boron oxide layer.

Substrate 112 is a polymeric film. By "film" is meant a material having length and width dimensions that are substantially greater than the material's thickness. Included within the concept of a "film" are a tape, a ribbon and a roll, which generally describe a material that also has a length dimension that is substantially greater than its width, the width also being substantially greater than the thickness. Such materials are often provided with a central core about which the material is wrapped in multiple windings so as to facilitate processing steps during which the protective structure is applied to the substrate (e.g., in roll-to-roll production), additional manufacturing operations, or post-processing handling, storage and shipping. Also included within the concept of a "film" is a sheet, page or panel, which generally describe a material that has length and width dimension that are more nearly equal. Such materials are often handled in a stack of multiple individual layers that facilitate processing steps during which the protective structure is applied to the substrate in a sheet-fed or a similar sheeting type operation.

The term "polymeric" refers to homopolymers and copolymers, as well as homopolymers or copolymers that may be formed in a miscible blend, for example, by coextrusion or by reaction, including, e.g., transesterification. The term "copolymer" describes materials that are derived from two or more different monomeric units and includes random, block and graft copolymers. Polymers suitable for providing substrate 112 may be any of a number of known polymers such as thermoset (crosslinked), thermosettable (crosslinkable), or thermoplastic polymers that are capable of being formed into a film, including acrylates (including methacrylates such as polymethylmethacrylate), polyols (including polyvinyl alcohols), epoxy resins, silanes, siloxanes (with all types of variants thereof), polyvinyl pyrrolidones, polyimides, polyamides, poly (phenylene sulphide), polysulfones, phenol-formaldehyde resins, cellulose ethers and esters (for example, cellulose acetate, cellulose acetate butyrate, etc.), nitrocelluloses, polyurethanes, polyesters (for example, poly (ethylene terephthalate), poly (ethylene naphthalate)), polycarbonates, polyolefins (for example, polyethylene, polypropylene, polychloroprene, polyisobutylene, polytetrafluoroethylene, polychlorotrifluoroethylene, poly (p-chlorostyrene), polyvinylidene fluoride, polyvinylchloride, polystyrene, etc.), phenolic resins (for example, novolak and resole resins), polyvinylacetates, styrene/acrylonitriles, styrene/maleic anhydrides, polyoxymethylenes, polyvinylnaphthalenes, polyetheretherketones, polyaryletherketones, fluoropolymers, poly α-methyl styrenes, polyarylates, polyphenylene oxides, polyetherimides, polyarylsulfones, polyethersulfones, polyamideimides, polyphthalamides, and polyvinylidene chlorides.

For some applications it may be desirable for substrate 112 to have a visible light transmission, for example a transmission of at least about 70%, at a visible light wavelength of interest. In other applications it may be desirable for the substrate to be oriented, biaxially oriented, and/or heat-stabilized. In some cases, it may be desirable for substrate 112 to be flexible, by which it is meant that substrate 112 can be wrapped about a core to produce a roll having multiple windings as described above. The thickness of substrate 112 is largely dictated by the intended application for the protected polymeric film, but for many uses a thickness of about 0.01 to 1 mm, more preferably about 0.05 to 0.25 mm is quite useful.

With continued reference to FIG. 4, protective structure 114 comprises a layer of boron oxide 116 and an inorganic barrier layer 118. Several advantages are associated with using boron oxide, although it will be understood that not every advantage will necessarily be reflected in each application that incorporates the protected polymeric films. Boron oxide may be deposited on or otherwise applied to the polymeric film substrate as an optically clear or transparent glass-like material, which may be advantageous for applications where this layer needs to be transmissive to light such as in an organic electroluminescent device. In addition, the boron oxide layer may reduce the inherent tendency of a polymeric film substrate to transmit moisture, whether emanating from the ambient environment or from components formed on or attached to the substrate.

Boron oxide layer 116 is provided on that portion of polymeric film substrate 112 that is intended to be protected against moisture transmission and will be determined by the individual application. The thickness of boron oxide layer 116 will also vary substantially depending upon the nature of the application for protected polymeric film 110, moisture conditions to which the protected polymeric film is likely to be exposed during use, other layers present in protective structure 114, requirements for optical transparency and mechanical flexibility of the protected polymeric film, cost, etc. As layer thickness increases, resistance to moisture transmission will increase, but perhaps at the expense of reduced transparency, reduced flexibility, and increased cost.

Boron oxide layer 116 is similar to boron oxide layer 16, and the foregoing discussion of boron oxide layer 16 is applicable to boron oxide layer 116.

Still referring to FIG. 4, protective structure 114 also comprises inorganic barrier layer 118, which cooperates with boron oxide layer 116 to protect polymeric film substrate 112. Inorganic barrier layer 118 may provide protection against exposure to moisture, oxygen, and heat and/or mechanical impact, although it is most often included as a moisture and/or oxygen barrier. In this capacity, it is preferred that inorganic barrier layer 118 be impermeable to moisture, or that it at least be strongly resistant to the transmission of moisture. It is also preferred that inorganic barrier layer 118 not be reactive with boron oxide layer 116, polymeric film substrate 112, other layers adjacent to the inorganic barrier layer, and any components formed on or attached to the polymeric film substrate. In certain applications it may be desirable for inorganic barrier layer 118 to be deposited or otherwise applied as an optically clear or transparent material, which may be advantageous for applications where this layer needs to be transmissive to light such as in an organic electroluminescent device. Inorganic barrier layer 118 is similar to inorganic barrier layer 22, and the foregoing discussion of inorganic barrier layer 22 is applicable to inorganic barrier layer 118.

The thickness of inorganic barrier layer 118 will also vary substantially depending upon the nature of the application for protected polymeric film 110, moisture conditions to which the protected polymeric film is likely to be exposed during use, other layers present in protective structure 114, requirements for optical transparency and mechanical flexibility of the protected polymeric film, cost, etc. As layer thickness increases, resistance to moisture transmission will increase, but perhaps at the expense of reduced transparency, reduced flexibility, and increased cost. Within these guidelines inorganic barrier layer 118 is provided at an effective thickness, by which is meant a thickness sufficient to increase the ability of the polymeric film to resist transmission of moisture, resist thermal and/or mechanical impact, etc. relative to the same polymeric film that does not have a protective structure that includes the inorganic barrier layer. More specifically, the inorganic barrier layer is preferably provided at a thickness of about 0.5 µm to 70 µm, more preferably about 1.5 µm to 40 µm, and even more preferably about 3.5 µm to 30 µm.

The embodiment of protected polymeric film 110 shown in FIG. 4, where boron oxide layer 116 is intermediate inorganic barrier layer 118 and polymeric film substrate 112 (i.e., encroaching moisture encounters the inorganic barrier layer before encountering the boron oxide layer), offers certain advantages. This arrangement permits boron oxide layer 116 to be deposited in an essentially continuous layer, but without the need to rigorously avoid forming pinholes and other similar defects that frequently accompany vapor deposition and other processes because inorganic barrier layer 118 also resists moisture transmission and is the layer that first encounters encroaching moisture (relative to the boron oxide layer). This arrangement also permits boron oxide layer 116 to provide a "last line of defense" in reducing moisture transmission by polymeric film substrate 112.

Figure 5:
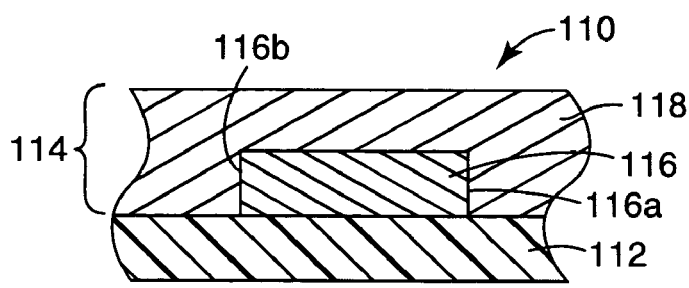
FIG. 5 is a schematic sectional view of a second embodiment of a protected polymeric film that may be used as a low moisture permeable substrate in an organic electroluminescent device according to the invention.

Turning now to FIG. 5, another embodiment of a protected polymeric film 110 is illustrated which is similar to the embodiment of FIG. 4, but offering the further advantage that inorganic barrier layer 118 encapsulates or seals lateral side edges 116a and 116b of boron oxide layer 116 so as to additionally protect this layer from being exposed to moisture at its edges. This embodiment may be particularly useful in higher moisture environments or where the boron oxide layer 116 is to be made available to only resist the transmission of moisture that has penetrated inorganic barrier layer 118.

Figure 6:
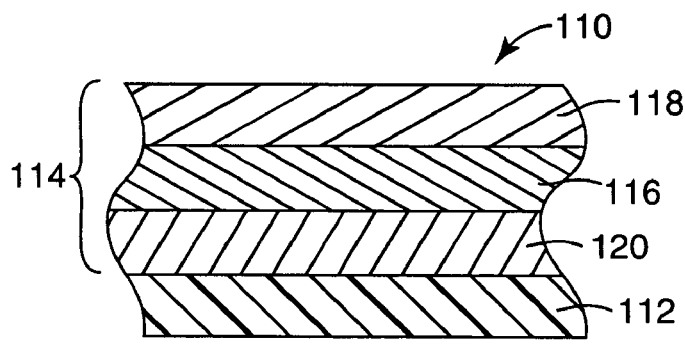
FIG. 6 is a schematic sectional view of a third embodiment of a protected polymeric film that may be used as a low moisture permeable substrate in an organic electroluminescent device according to the invention.
Figure 7:
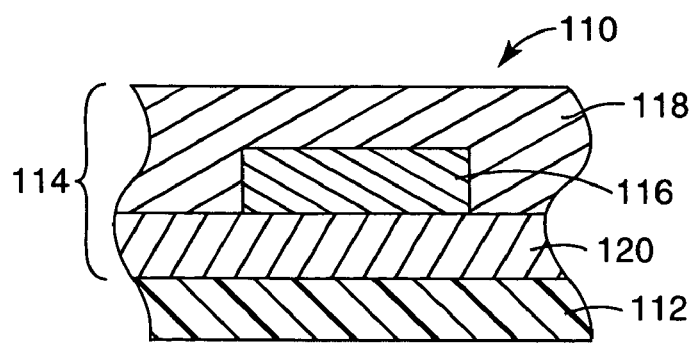
FIG. 7 is a schematic sectional view of a fourth embodiment of a protected polymeric film that may be used as a low moisture permeable substrate in an organic electroluminescent device according to the invention.

The embodiment of FIG. 6 is similar to the embodiment of FIG. 4 but further comprises a second inorganic barrier layer 120 that is disposed between boron oxide layer 116 and polymeric film substrate 112. Second inorganic barrier layer 120 is similar to inorganic barrier layer 118, and the foregoing discussion of inorganic barrier layer 118 is applicable to second inorganic barrier layer 120. The embodiment of FIG. 6 offers the additional advantage of giving enhanced protection to polymeric film substrate 112 as a result of second inorganic barrier layer 120. The embodiment of FIG. 7 is similar to the embodiment of FIG. 5 but further comprises a second inorganic barrier layer 120 like that shown in FIG. 6. Thus, in FIG. 7, inorganic barrier layers 118 and 120 cooperate to encapsulate or seal boron oxide layer 116 so as to additionally protect this layer from being exposed to moisture at its edges.

Figure 8:
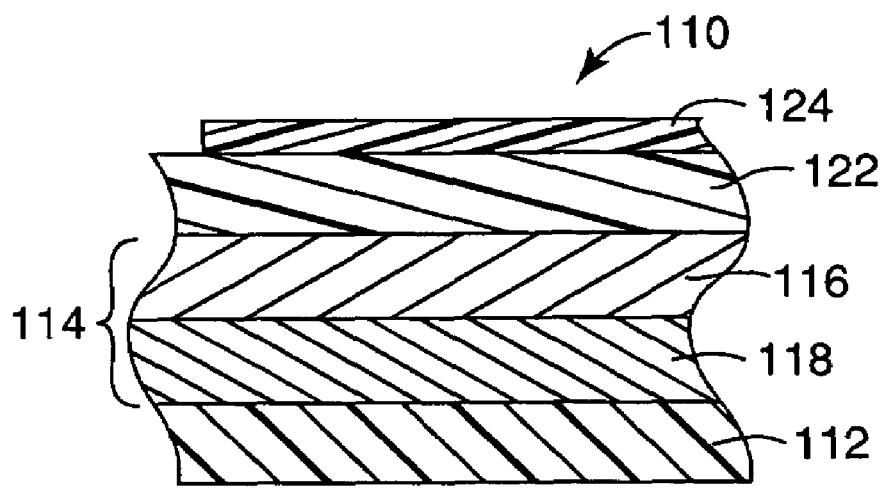
FIG. 8 is a schematic sectional view of a fifth embodiment of a protected polymeric film that may be used as a low moisture permeable substrate in an organic electroluminescent device according to the invention.

Turning now to FIG. 8, another embodiment of a protected polymeric film 110 is presented which is similar to the embodiment shown in FIG. 4 but further comprising an optional buffer layer 122, that separates the protective structure from components or other layers that are secured to or subsequently formed on the substrate, such components or layers being generically represented by reference numeral 124 in FIG. 8. Optional buffer layer 122 is similar to optional buffer layer 32, and the foregoing discussion of optional buffer layer 32 is applicable to optional buffer layer 122.

Figure 9:
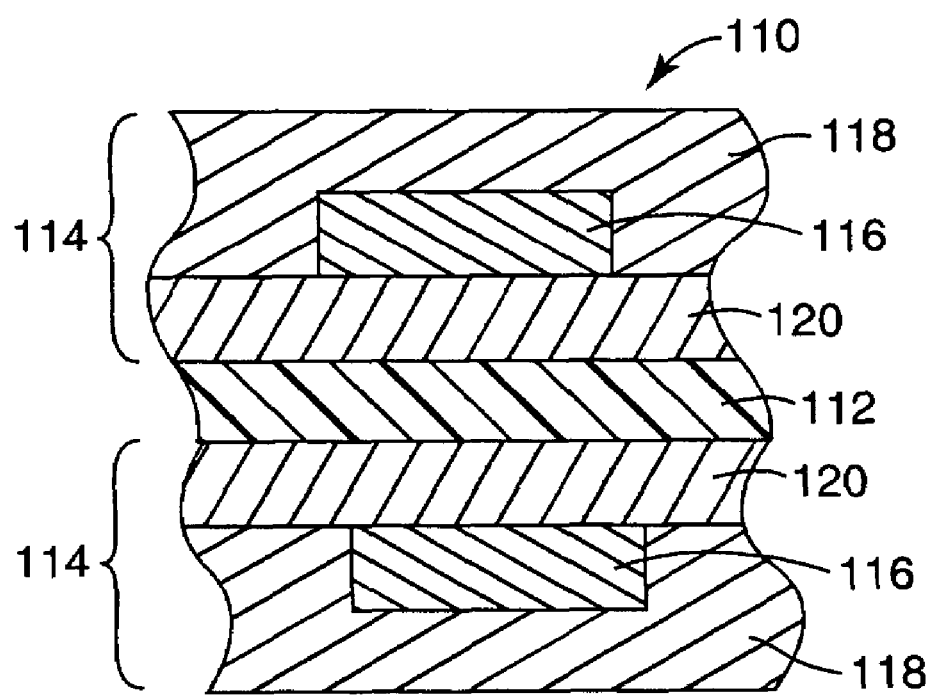
FIG. 9 is a schematic sectional view of a sixth embodiment of a protected polymeric film that may be used as a low moisture permeable substrate in an organic electroluminescent device according to the invention.

FIG. 9 illustrates an embodiment in which both first major surface 112a and second major surface 112b of polymeric film substrate 112 have been provided with a protective structure 114 comprising a layer of boron oxide 116 and an inorganic barrier layer 118. The embodiment of FIG. 9 further includes a second inorganic barrier layer 120 associated with each protective structure, although it will be understood that the second inorganic barrier layer is optional and may be excluded from one or both protective structures. Similarly, while FIG. 9 shows each layer of boron oxide 116 as having been encapsulated by the inorganic barrier layers, this is only optional.

Though not shown in the drawings, various functional layers or coatings can be added to protected polymeric film 110 to alter or improve physical or chemical properties, particularly at the surface of the film. Such layers or coatings can include, for example, visible light-transmissive conductive layers or electrodes (e.g., of indium tin oxide); antistatic coatings or films; flame retardants; UV stabilizers; abrasion resistant or hardcoat materials; optical coatings or filters; anti-fogging materials; magnetic or magneto-optic coatings or films; photographic emulsions; prismatic films; holographic films or images; adhesives such as pressure sensitive adhesives or hot melt adhesives; primers to promote adhesion to adjacent layers; and low adhesion backsize materials for use when the barrier assembly is to be used in adhesive roll form. These functional components can be incorporated into one or more of the outermost layers of the barrier assembly or can be applied as a separate film or coating.

The invention will now be described with reference to the following non-limiting examples, in which all parts and percentages are by weight unless otherwise indicated.

EXAMPLES

Unless otherwise indicated, the following abbreviations describe materials used in the examples and/or their source:

| Abbreviation | Description/Commercial Source |
|---|---|
| NPD | N,N'-bis(3-naphthalen-2-yl)-N,N'-bis(phenyl)benzidine available from H. W. Sands Corp, Jupiter, FL |
| $B_2O_3$ | Boron oxide, 99.9995%, 200 ppm $H_2O$, available from Alfa Aesar, Ward Hill, MA as stock# 11160 |
| AlQ | Tris(8-hydroxyquinoline) aluminum available from H. W. Sands Corp, Jupiter, FL |
| C545T | Coumarin available from Eastman Kodak Co., Rochester, NY as Coumarin 545T |
| FTCNQ | Tetrafluoro-tetracyanoquinodimethane available from Tokyo Kasei Kogyo Co., Tokyo, Japan |
| PEDOT | A mixture of water and 3,4-polyethylenedioxythiophene-polystyrenesulfonate available from H. C. Starck, Newton, MA as PEDOT VP AI 4083 |
| LiF | Lithium fluoride, 99.85%, available from Alfa Aesar, Ward Hill, MA as product number 36359 |
| Al | Puratronic aluminum shots, 99.999%, available from Alfa Aesar, Ward Hill, MA |
| MTDATA | 4,4',4''-tris(N-3-methylphenyl-N-phenylamino)triphenylamine, sublimed, available from H. W. Sands Corp., Jupiter, FL as product number OSA3939 |
| ITO | Indium tin oxide |
| OEL | Organic electroluminescent |
| OLED | Organic light-emitting diode |
| RPM | Revolutions per minute |
| Thermo-bond 845-EG-2.5 | A hot melt adhesive film available from 3M Company, St. Paul, MN, as Thermo-bond 845-EG with a thickness of 2.5 mils |
| HIL | Hole injection layer |
| SR399 | Dipentaaerithritol penta acrylate available from Sartomer Company, Exton, PA as SR339 |
| β-CEA | β-carboxyethyl acrylate available from UCB Radcure Inc., N. Augusta, SC, as BCEA |
| EHPE3150 | Alicyclic epoxy resin available from Daicel Chemical Industries, Fort Lee, NJ, as Polyester EHPE3150 |
| Ebecryl 629 | Epoxy novolac acrylate available from UCB Radcure Inc., N. Augusta, SC, as Ebecryl 629 |
| Irgacure 184 | 1-hydroxycyclohexyl phenyl ketone available from Ciba Specialty Chemicals Corporation, Tarrytown, NY, as Irgacure 184 |
| UVI-6974 | Triarylsulfonium hexafluoroantimonate available from Ciba Specialty Chemicals Corporation, Tarrytown, NY, as Cyracure UVI-6974 |
| Fusion D UV Lamp | A UV lamp available from Fusion UV Systems, Gaithersburg, MD, under the trade designation F600 Fusion D UV Lamp |
| Fusion H UV Lamp | A UV lamp available from Fusion UV Systems, Gaithersburg, MD, under the trade designation F600 Fusion H UV Lamp |
| SiAlO | Silicon aluminum oxide |
| MEK | Methyl ethyl ketone |
| PET | Polyethylene terephthalate |
| CAG150 | A microgravure coater available from Yasui Seiki Co. (USA), Bloomington, IN, as Model CAG 150 and fitted with a 110R knurl |
| Ag | Silver (target available from Arconium, Providence RI) |
| HSPE | A PET film available from Teijin Corp., Japan, as HSPE 100 (thickness = 100 microns) or HSPE 50 (thickness = 50 microns) |
| 8141 Adhesive | An optically clear thin film laminating adhesive available from 3M Company, St. Paul, MN as 3M 8141 |

Materials referred to in the examples but not identified in the foregoing table may be obtained from Aldrich Chemical Company, Milwaukee, Wis.

In the following examples, unless otherwise noted, all glass substrates were subjected to the following cleaning procedure prior to use: sonication in a warm (about 110° F.) detergent solution (Deconex 12 NS, Borer Chemie, Zuchwil, Switzerland) for about 5 minutes; rinsing in warm (about 110° F.) deionized water for about 10 minutes; and drying in a nitrogen purged oven for at least 4 hours.

Example 1

An OEL device according to the invention was prepared in Example 1 and comprised a glass (i.e., a low moisture permeable) substrate that supported a first electrode, a second electrode, and a light-emitting structure disposed between the first and second electrodes. A protective structure comprising a layer of boron oxide and an inorganic barrier layer was also provided, with the layer of boron oxide being in direct contact with the operational layers of the OEL device (i.e., the light-emitting structure and the first and second electrodes).

Glass substrates measuring 50 mm×50 mm square were patterned with an ITO layer in the form of four pixels each measuring 0.25 cm² (20 Ohm/sq ITO coated glass, available from Delta Technologies Ltd., Stillwater Minn.). A solution of PEDOT (1% solids) was spun coat at 2500 RPM for 30 seconds onto the substrates, and was then dried at 85° C. for 15 minutes under a nitrogen atmosphere. A green emitting OLED stack was then deposited on top of the PEDOT layer by thermal evaporation using a vacuum chamber at approximately $5 \times 10^{-6}$ Torr. More specifically, the OLED stack was provided by depositing the following layers on top of the PEDOT layer (in the order stated): NPD (400 Å at 1 Å/s)/AlQ:C545T (1% doping, 300 Å at 1 Å/s)/AlQ (200 Å at 1 Å/s)/LiF(7 Å at 0.5 Å/s)/Al (2500 Å at 25 Å/s).

A protective structure for the OEL device was then applied by depositing 3000 Å of $B_2O_3$ on top of the aluminum layer so as to encapsulate the operational components of the OEL device. The $B_2O_3$ was applied via thermal evaporation (at a rate of approximately 3-5 Å/s) from a tungsten dimple source (S8A-0.010W, R. D. Mathis, Signal Hill, Calif.).

Device efficiencies were measured using a photo-optically corrected silicon photodiode (UDT Sensors, Hawthorne, Calif.) before and after encapsulation of the operational components by the protective structure; no substantive differences in device efficiency were observed.

Example 2

OEL devices having layers formed from aqueous solutions with and without protective structure encapsulation were prepared in Example 2. A PEDOT layer was spun coat at 2500 RPM for 30 seconds onto patterned ITO glass substrates, the latter as described in Example 1, and the coated substrates were then dried for 15 min at 85° C. under a nitrogen atmosphere. The green emitting OLED stack of Example 1 was then vapor deposited on top of the PEDOT coated glass substrates as described in Example 1.

A few of these devices ("test devices") were then encapsulated with a protective structure by thermally evaporating 3000 Å of $B_2O_3$ on top of the operational components (using the procedure described in Example 1 to apply the layer of $B_2O_3$) and hand laminating a copper foil on top of the $B_2O_3$ layer using Thermo-Bond 845-EG-2.5 hot melt adhesive. A few other devices ("control devices") were completed by hand laminating a copper foil on top of the OEL device operational components using Thermo-Bond 845-EG-2.5 hot melt adhesive but without including a layer of $B_2O_3$.

Both the test devices and the control devices were stored under ambient conditions for one week and the electroluminescence (EL) images of all pixels were taken using a stereomicroscope (Stemi SV11 APO, Zeiss, Germany) outfitted with a color CCD camera (DC330, DAGE MTI Inc., Michigan City, Ind.). EL images were then taken every two weeks and "dark spot" growth was compared for the test and control devices. (Dark spot growth is a sign of degradation of the device by moisture.) The control devices degraded significantly relative to the test devices. After approximately 3 months of storage under ambient conditions, the control devices were almost completely covered by non-emissive areas (i.e., dark spots) while the test devices showed negligible dark spot growth.

Example 3

OEL devices with and without protective structure encapsulation were prepared in Example 3, these devices being fabricated without layers cast from aqueous solutions. A planarizing HIL (MTDATA:FTCNQ (2.8% doping, 3000 Å)) was vapor deposited on top of patterned ITO glass substrates, the substrates being as described in Example 1. The green emitting OLED stack of Example 1 was then deposited on top of the HIL using the deposition procedure described in Example 1.

A few of these samples were coated with an AlQ buffer layer (1000 Å, 1 Å/s) that was thermally deposited on top of the aluminum cathode. These devices were then encapsulated with a protective structure by thermally evaporating 3000 Å of $B_2O_3$ on top of the operational components and the buffer layer (using the procedure described in Example 1 to apply the layer of $B_2O_3$) and hand laminating a copper foil on top of the $B_2O_3$ layer using Thermo-Bond 845-EG-2.5 hot melt adhesive. These samples are referred to as "test devices."

A few other devices were completed by hand laminating a copper foil on top of the OEL device operational components using Thermo-Bond 845-EG-2.5 hot melt adhesive but without including a buffer layer or a layer of $B_2O_3$. These samples are referred to as "control devices."

The test devices and the control devices were then stored under ambient conditions and EL images of the devices were then taken as a function of time using the technique described in Example 2 to compare dark spot growth in the test devices and the control devices. After 1 week of storage the control devices showed significant dark spot growth indicating moisture intrusion, while the test devices showed negligible dark spot growth. For the test devices it is believed that moisture entering the device was consumed by the layer of $B_2O_3$ thereby demonstrating that $B_2O_3$ can scavenge water that may enter an OEL device after fabrication and arising from sources external to the device.

Example 4

Example 4 was prepared to evaluate the effectiveness of a vapor deposited inorganic barrier layer on top of a $B_2O_3$ layer in reducing the transmission of moisture to a highly reactive calcium metal layer. In a nitrogen atmosphere glove box, six oxygen plasma cleaned (5 minutes at full power and 5 psi oxygen, Plasma-Preen II-973, Plasmatic Systems, Inc., North Brunswick, N.J.) 22 mm glass cover slip substrates were placed over metal shadow masks containing a 10 mm×10 mm square opening in the center. These were loaded into a thin film evaporation chamber located inside a glove box and the chamber was evacuated to $7 \times 10^{-7}$ Torr. Calcium was thermally evaporated from a BN crucible at about 2 Å/second until 2000 Å had been deposited.

Three calcium coated glass cover slip substrates were processed as "test devices." $B_2O_3$ (500 Å) was deposited through the 10 mm×10 mm square shadow mask at about 1.5 Å/second ($6 \times 10^{-7}$ Torr chamber pressure) from a tungsten boat. The 10 mm×10 mm square shadow masks were then replaced by shadow masks having 20×20 mm openings, placed so that the original 10 mm×10 mm square deposition was centered within the 20×20 mm mask. A silicon monoxide inorganic barrier layer (1000 Å) was then evaporated from a tungsten boat at about 1 Å/second ($5 \times 10^{-6}$ Torr chamber pressure) to yield three test devices having a glass cover slip substrate and, in order, 2000 Å calcium, 500 Å $B_2O_3$, and 1000 Å silicon monoxide.

The three remaining calcium coated glass cover slip substrates were processed as "control devices" not containing an inorganic barrier silicon monoxide layer. The substrates were placed over the shadow masks containing 20×20 mm openings and the thin film evaporation chamber was evacuated to $1 \times 10^{-7}$ Torr. Boron oxide (1500 Å) was evaporated at about 1 Å/second from a tungsten boat to yield three control devices consisting of 2000 Å calcium covered by 1500 Å $B_2O_3$, but without the silicon monoxide inorganic barrier layer.

One control device and one test device was removed from the glove box and stored in ambient air along with a glass cover slip substrate coated only with 2000 Å calcium. The condition of the calcium layer was visually monitored with the following results.

In the devices containing only the 2000 Å calcium layer on the glass cover slip substrate, the calcium layer rapidly degraded; the metallic mirror-like appearance disappeared after approximately 20 minutes of air exposure and the calcium layer was almost transparent after about 2-3 hours.

Each control device still retained its metallic mirror-like appearance after 2.75 hours of air exposure, however a slight haze in the originally optically clear $B_2O_3$ layer was observed. After about 24 hours of air exposure, a noticeable reduction in the optical density of the calcium layer was detected along with a few clear holes in the calcium layer but, in general, the calcium layer retained its metallic mirror-like appearance when observed through the glass cover slip. After about 54 hours of air exposure, the metallic mirror-like appearance of the calcium layer had essentially vanished from the control devices.

Each test device retained its metallic mirror-like appearance after 2.75 hours of air exposure. After 24 hours of air exposure, most of the metallic mirror-like appearance in the test device remained, although there was a slight reduction in the optical density of the calcium layer as observed by the human eye (i.e., several small hazy spots were observed in the calcium layer). After about 54 hours of air exposure, the calcium layer was quite mottled in appearance but still retained its metallic mirror-like appearance in many areas. After about 119 hours of air exposure, the calcium layer was considered to be fairly transparent, although some small spots having a metallic mirror-like appearance still remained.

Example 5

OEL devices according to the invention were prepared in Example 5 to evaluate the effect of the $B_2O_3$ layer on the light emitting capabilities of the device. Nine 22 mm square (1 mm thick) ITO coated glass substrates (15 ohm/square, Colorado Concept Coatings LLC, Longmont, Colo.) were cleaned by rubbing with a methanol soaked lint-free cloth (Vectra Alpha 10, Texwipe Co., LLC, Upper Saddle River, N.J.) followed by a 4 min oxygen plasma treatment at 50 watts and 200 mTorr oxygen, (Micro-RIE Series 80, Technics, Inc., Dublin, Calif.). PEDOT was spun coat onto the cleaned substrates at 2500 RPM for 30 seconds and the substrates were dried on a 110° C. hot plate for 20 minutes under a nitrogen atmosphere. The substrates were placed in a bell jar type OLED deposition chamber and the system was evacuated to $5\times10^{-6}$ Torr. NPD (300 Å, 1 Å/sec), AlQ doped with 2% C545T (300 Å, 1 Å/sec), and AlQ (200 Å, 1 Å/sec) were sequentially evaporated in the order noted through a 20 mm square shadow mask and the samples were transferred to a glove box that contained a thin film evaporation chamber (Edwards 500, BOC Edwards, England) for the thermal deposition of cathodes.

Three samples each containing three substrates were then prepared. In one sample, AlQ (300 Å, 1 Å/sec), LiF (7 Å, 0.5 Å/sec), aluminum (200 Å, 1 Å/sec), and silver (1,000 Å, 2 Å/sec) were sequentially deposited in the order noted at about $10^{-7}$ Torr through a 1 cm$^2$ circular shadow mask. In the second sample, $B_2O_3$:AlQ (approximate 1:2 ratio, 300 Å, 2 Å/sec), lithium fluoride (7 Å, 0.5 Å/sec), aluminum (200 Å, 1 Å/sec), and silver (1,000 Å, 2 Å/sec) were sequentially deposited in the order noted at about $10^{-7}$ Torr through a 1 cm$^2$ circular shadow mask. In the third sample, $B_2O_3$:AlQ (approximate 2:1 ratio, 200 Å, 2 Å/sec), lithium fluoride (7 Å, 0.5 Å/sec), aluminum (200 Å, 1 Å/sec), and silver (1,000 Å, 2 Å/sec) were sequentially deposited in the order noted at about $10^{-7}$ Torr through a 1 cm$^2$ circular shadow mask. All nine devices emitted green light when powered at 6 volts DC. The presence of the $B_2O_3$ layer did not adversely affect the light emitting characteristics of the OEL devices.

Example 6

An OLED device according to the invention and incorporating a protected polymeric film was prepared in Example 6. A UV-curable solution was prepared by combining 80 grams Ebecryl 629, 20 grams SR399, and 2 grams Irgacurel 84 that had been dissolved in 1000 grams of MEK. The resulting solution was coated onto a roll of 6.5 inch wide HSPE 100 PET film substrate using a CAG 150 microgravure coater operating at 20 ft/min. The coating was subsequently in-line dried at 70° C. and then cured under a nitrogen atmosphere with a Fusion D UV Lamp operating at 100% power. This resulted in a transparent PET film substrate having an approximately 0.7 μm thick transparent coating thereon.

A polymer web mask commercially available from 3M Company under the trade designation Scotchpak 1220 was die cut and then thermally laminated to the coated surface of the PET film substrate using a roll-to-roll laminator. An approximately 35 m thick layer of ITO, followed by an approximately 10 nm thick layer of Ag, followed by another approximately 35 nm thick layer of ITO were sequentially deposited on the coated surface of the PET film substrate using a DC sputtering process employing a pressure of 1 mTorr, 1 kW of power, and argon and oxygen flow rates of 150 sccm and 6 sccm, respectively, for coating the ITO, and an argon flow rate of 150 sccm for coating the Ag. These coating conditions resulted in a sheet resistance of 10 ohms/square. The ITO layers served as anodes and as robust contacts for the cathodes for the subsequently formed OLED devices.

The polymer mask was then peeled off resulting in a conductive pattern on the PET film substrate. A sample of the conductive patterned substrate measuring 50 mm×50 mm was cut from the roll and contained four pixels each measuring 0.25 cm$^2$. The sample was ultrasonically cleaned by sonication in a warm (about 110° F.) detergent solution (Deconex 12 NS, Borer Chemie, Zuchwil, Switzerland) for about 5 minutes, rinsing in warm (about 110° F.) deionized water for about 10 min, and drying in a nitrogen purged oven for at least 4 hours. The ITO/Ag/ITO surface was then plasma treated for 2 minutes at a pressure of 300 mTorr, oxygen flow rate of 500 sccm, and RF power of 400 watts in a plasma treater commercially available from AST, Inc., Billerica, Mass., under the trade designation Model PS 500.

A hole-injecting layer (MTDATA:FTCNQ (2.8% doping)) was vapor deposited at a rate of 1.8 Å/s to a thickness of 3,000 Å on top of the conductive pattern on the PET film substrate. The green emitting OLED stack of Example 1 was then vapor deposited on top of the hole-injecting layer using thermal evaporation in a vacuum chamber at about $5\times10^{-6}$ Torr. The device structure was completed using the following sequential depositions over the hole-injecting layer: NPD (400 Å, 1 Å/s)/AlQ:C545T(1% doping, 300 Å, 1 Å/s)/AlQ(200 Å, 1 Å/s)/LiF(7 Å, 0.5 Å/s)/Al(2500 Å, 25 Å/s).

The operational components of the OLED devices were then encapsulated by depositing 3,000 Å of $B_2O_3$ on top of the device structure layers using thermal evaporation (about 3-5 Å/s) from a tungsten dimple source (S8A-0.010W, R. D. Mathis, Signal Hill, Calif.) A 2 mil thick protective copper foil inorganic barrier layer was then thermally laminated at a temperature of approximately 80° C. using a hand-operated rubber roller on top of the $B_2O_3$ layer and with Thermo-bond 845-EG-2.5. The copper foil was large enough to encapsulate the emitting areas of the four pixels, but the edges of the PET film substrate remained exposed to provide a point for electrical contact. For convenience, this is referred as "OLED Device A." Device efficiencies for OLED Device A were measured using a photo-optically corrected silicon photodiode (UDT Sensors, Hawthorne, Calif.).

The effect on device efficiency of incorporating a protected polymeric film according to the invention into OLED Device A was then assessed.

A 3,000 Å thick layer of $B_2O_3$ was deposited on the surface of the PET film substrate opposite the surface on which the device structure had been deposited and using the deposition conditions described above for the previously applied $B_2O_3$ layer.

A multilayer inorganic barrier layer was then prepared by laminating a pair of multilayer assemblies in face-to-face fashion with an optical adhesive. Each assembly comprised six alternating layers of polymer and inorganic material formed on a PET base. When completed, the laminated multilayer inorganic barrier had the following construction: PET base/Polymer 1/SiAlO/Polymer 2/SiAlO/Polymer 2/SiAlO/Optical Adhesive/SiAlO/Polymer 2/SiAlO/Polymer 2/SiAlO/Polymer 1/PET base. Each assembly was formed as described in the following paragraphs.

PET base+Polymer 1 ("Layer 1"). HSPE 50 PET base film was coated with a UV-curable solution that was prepared by mixing 145.5 grams Ebecryl 629, 37.5 grams β-CEA, and 9.03 grams Irgacure 184 that had been dissolved in 972 grams MEK using a CAG-150 microgravure coater operating at 6.1 m/min. The coating was cured using a Fusion H UV Lamp running at 100% power to provide Polymer 1.

SiAlO Layer ("Layer 2"). The PET base film coated with Polymer 1 (i.e., Layer 1) was then loaded into a roll-to-roll sputter coater and the deposition chamber was pumped down to a pressure of $2\times10^{-6}$ Torr. A 60 nm thick SiAlO inorganic oxide layer was deposited atop Polymer 1 by reactively sputtering a Si—Al target (90%-10% Si—Al target commercially available from Academy Precision Materials, Albuquerque, N. Mex.) using 2 kW and 600V, a gas mixture containing 51 sccm argon and 30 sccm oxygen at a pressure of 1 mTorr, and a web speed of 0.43 m/min.

Polymer 2 ("Layer 3"). Using the conditions described for the application and curing of Polymer 1 but with the CAG 150 microgravure coater operating at a speed of 4.6 m/min, the previously applied SiAlO layer was overcoated with a UV-curable solution that was prepared by combining 2.25 grams UVI-6974, 42.75 grams EHPE3150 in 405 grams MEK, and then cured to provide Polymer 2.

Using the same conditions as for Layer 2 and Layer 3, respectively, a second SiAlO layer was deposited atop Layer 3 to form Layer 4, a second layer of Polymer 2 was coated atop Layer 4 to form Layer 5, and a third layer of SiAlO was deposited atop Layer 5 to form Layer 6, thereby providing an assembly having a PET base/Polymer 1/SiAlO/Polymer 2/SiAlO/Polymer 2/SiAlO configuration.

The resulting assembly was split into two rolls and laminated together in face-to-face fashion using 8141 Adhesive and a two-roll laminator to form a multilayer inorganic barrier.

The multilayer inorganic barrier was then laminated to the exposed $B_2O_3$ layer with 8141 Adhesive thereby completing the incorporation of a protected polymeric film into OLED device A. Device efficiencies were measured again and using the same procedure as employed previously. Incorporating a protected polymeric film according to the invention into OLED Device A did not significantly change the efficiency of the resulting device.

Example 7

An OLED device according to the invention and incorporating a protected polymeric film was prepared in Example 2. Additional samples of OLED Device A from Example 6 were prepared and the copper foil was edge sealed using a thin bead of epoxy (Araldite 2014 available from Huntsman LLC, Advanced Materials Division, Vantico, East Lansing, Mich.). The epoxy was allowed to cure to hardness over 12 hours in a $N_2$ atmosphere at room temperature. For convenience, this is referred to as "OLED Device B."

An inorganic barrier layer was then prepared according to the following procedure. A UV-curable polymer solution was prepared by combining 2.25 grams UVI-6974 with 42.75 grams EHPE3150 in 405 grams MEK. The resulting solution was coated onto a 6.5 inch wide, 100 micron thick fluorine polyester film commercially available from Ferrania Imaging Technologies, Italy, under the trade designation Arylite using a CAG 150 microgravure coater operating at a speed of 15 ft/min. The coating was subsequently in-line dried at 70° C. and then cured under a nitrogen atmosphere with a Fusion D UV Lamp operating at 100% power. This resulted in a transparent film having an approximately 0.7 µm thick transparent coating thereon.

The coated film was loaded into a sputter coater and the deposition chamber was pumped down to a pressure of $2\times10^{-6}$ Torr. A 60 nm thick SiAlO inorganic oxide layer was deposited using 370 W and 375 V, a gas mixture containing 20 sccm argon and 18 sccm oxygen at a pressure of 6 mTorr, and a web speed of 7 inches/minute. A 90/10 target of Si/Al available from Applied Precision Materials, Albuquerque, N. Mex. was used as the target material.

Inorganic barrier layers were then incorporated into previously prepared samples of OLED Device B to form, respectively, OLED Device B1 and OLED Device B2.

OLED Device B1 was prepared by depositing a 3,000 Å thick layer of $B_2O_3$ on the surface of the PET film substrate opposite the surface on which the device structure had been built. The $B_2O_3$ was deposited using thermal evaporation (~3-5 Å/second) from a tungsten dimple source (S8A-0.010W, R. D. Mathis, Signal Hill, Calif.). The previously prepared inorganic barrier layer was then laminated over the exposed $B_2O_3$ layer using 8141 Adhesive and a two-roll laminator to complete OLED Device B1.

OLED Device B2 was prepared by laminating the previously prepared inorganic barrier layer to the "front side" surface of the PET film substrate (i.e., the surface opposite the surface on which the device structure had been build) by using 8141 Adhesive and a roll-to-roll laminator. Thus, OLED Device B2 differed from OLED Device B1 in that it lacked the $B_2O_3$ layer used on the front side of OLED Device B1.

The samples (OLED Device B1 and OLED Device B2) were stored under ambient conditions. Photographs of the lit devices (i.e., OLED Device B1 and OLED Device B2) were taken periodically to compare dark spot growth. Samples of OLED Device B2 (i.e., without $B_2O_3$ on the front side) showed significantly more dark spot growth over time than samples of OLED Device B1 having the $B_2O_3$ layer on the front side.

The invention is amenable to various modifications and alternative forms, specifics thereof having been shown by way of example in the foregoing drawings and description. It will be understood, however, that the invention is not limited to these particular embodiments. On the contrary, the intention is to cover all modifications, equivalents and alternatives falling within the spirit and scope of the invention, which is defined by the appended claims. Various modifications and equivalent processes, as well as numerous structures to which the present invention may be applicable, will be readily apparent to those of skill in the art to which the present invention is directed.

What is claimed is:

1. An organic electroluminescent device comprising:
    a) a low moisture permeable substrate that supports a first electrode, a second electrode, and a light emitting structure disposed between the first and second electrodes; and
    b) a protective structure that cooperates with the substrate to encapsulate the first electrode, the second electrode, and the light-emitting structure, wherein the protective structure comprises a layer of boron oxide and an inorganic barrier layer, wherein the inorganic barrier layer comprises a material different from the layer of boron oxide,
    wherein the boron oxide layer functions to absorb moisture in order to reduce absorption of the moisture by the light emitting structure.

2. An organic electroluminescent device according to claim 1, wherein the inorganic barrier layer has low permeability to moisture.

3. An organic electroluminescent device according to claim 1, wherein the layer of boron oxide is disposed over the first electrode, the second electrode, and the light-emitting structure, and the inorganic baffler layer is disposed over the layer of boron oxide.

4. An organic electroluminescent device according to claim 3, wherein the inorganic barrier layer comprises an inorganic oxide.

5. An organic electroluminescent device according to claim 4, wherein the inorganic oxide is silicon oxide.

6. An organic electroluminescent device according to claim 1, wherein the device further includes a buffer layer disposed between the protective structure, and the first electrode, second electrode, and light emitting structure.

7. An organic electroluminescent device according to claim 6, wherein the buffer layer protects the layer of boron oxide from reaction with the first electrode, the second electrode, or the light-emitting structure.

8. An organic electroluminescent device according to claim 6, wherein the buffer layer is disposed over the first electrode, the second electrode, and the light-emitting structure, the layer of boron oxide is disposed over the buffer layer, and the inorganic barrier layer is disposed over the layer of boron oxide.

9. An organic electroluminescent device according to claim 8, wherein the buffer layer comprises an organometallic compound or a chelate compound.

10. An organic electroluminescent device according to claim 6, wherein the protective structure further comprises a second inorganic barrier layer.

11. An organic electroluminescent device according to claim 10, wherein the buffer layer is disposed over the first electrode, the second electrode, and the light-emitting structure, the inorganic barrier layer is disposed over the buffer layer, the layer of boron oxide is disposed over the inorganic barrier layer, and the second inorganic barrier layer is disposed over the layer of boron oxide.

12. An organic electroluminescent device according to claim 1, wherein the substrate is selected from glass, silicon, aluminum, copper and stainless steel.

13. An organic electroluminescent device according to claim 1, wherein the substrate is a protected polymeric film.

14. An organic electroluminescent device according to claim 1, wherein the layer of boron oxide is transparent to light emitted by the light-emitting structure.

15. An organic electroluminescent device according to claim 1, wherein the inorganic barrier layer comprises a multilayer construction comprising alternating polymeric and inorganic layers.

* * * * *

UNITED STATES PATENT AND TRADEMARK OFFICE
CERTIFICATE OF CORRECTION

PATENT NO. : 7,342,356 B2  
APPLICATION NO. : 10/948011  
DATED : March 11, 2008  
INVENTOR(S) : Fred B. McCormick It is certified that error appears in the above-identified patent and that said Letters Patent is hereby corrected as shown below:

Column 4,
Line 15, Delete "(Modem" and insert -- Modern --, therefor.

Column 5,
Line 9, Delete "α-electron" and insert -- π-electron --, therefor.

Column 17,
Line 35, Delete "Irgacurel 84" and insert -- Irgacure1 84 --, therefor.
Line 48, Delete "35 m" and insert -- 35 nm --, therefor.

Column 20,
Line 59, In Claim 3, delete "baffler" and insert -- barrier --, therefor.

Signed and Sealed this

Twenty-ninth Day of July, 2008

JON W. DUDAS  
*Director of the United States Patent and Trademark Office*